United States Patent [19]

Papathomas et al.

[11] Patent Number: 5,319,244
[45] Date of Patent: Jun. 7, 1994

[54] TRIAZINE THIN FILM ADHESIVES

[75] Inventors: Konstantinos I. Papathomas, Endicott; David W. Wang, Vestal; William J. Summa, Endwell; Ashit A. Mehta, Vestal, all of N.Y.

[73] Assignee: International Business Machines Corporation, Armonk, N.Y.

[21] Appl. No.: 806,410

[22] Filed: Dec. 13, 1991

[51] Int. Cl.$^5$ ............................................. B32B 3/00
[52] U.S. Cl. .................................. 257/701; 361/750; 361/751; 428/209; 428/901; 528/70; 528/98
[58] Field of Search ............. 257/678, 701, 702; 525/109, 114, 115, 122, 529, 534; 428/209, 901; 528/70, 98; 361/750, 751

[56] References Cited

U.S. PATENT DOCUMENTS

| | | | |
|---|---|---|---|
| 4,456,712 | 6/1984 | Christie et al. | 523/439 |
| 4,636,578 | 1/1987 | Feinberg | 257/788 |
| 4,725,484 | 2/1988 | Kumagawa | 428/220 |
| 4,745,215 | 5/1988 | Cox et al. | 560/301 |
| 4,782,116 | 11/1988 | Holte | 525/109 |
| 4,954,873 | 9/1990 | Lee et al. | 257/702 |
| 5,103,293 | 4/1992 | Bonafino et al. | 257/702 |
| 5,135,556 | 8/1992 | Hornback et al. | 257/702 |

OTHER PUBLICATIONS

"Printed Circuit Board Packaging" D. P. Seraphim et al, 1988, pp. 334–371.
"Polymers & Polymer-Based Composites For Electronic Applications" G. P. Schmitt et al; 1988, pp. 853–922.

*Primary Examiner*—Rolf Hille
*Assistant Examiner*—David Ostrowski
*Attorney, Agent, or Firm*—Richard M. Goldman

[57] ABSTRACT

Disclosed are thin film triazine adhesives on organic carriers, method for making them and microelectronic circuit packages incorporating them. The circuit package has a substrate made up of organic, dielectric, polymeric sheets. At least one pair of the polymeric sheets face each other and are adhesively joined together by a triazine polymer.

16 Claims, 3 Drawing Sheets

| A METHOD OF FABRICATING |
| A MICROELECTRONIC CIRCUIT PACKAGE |

| FORM A MONOMERIC COMPOSITION OF |
| TRIAZINE PRECURSOR |
| AND A POLYMERIZATION CATALYST |

| FORM A THIN FILM OF |
| THE MONOMERIC COMPOSITION ON |
| A POLYMERIC, DIELECTRIC FILM OVERLAY THE MONOMERIC |
| COMPOSITION |
| WITH A SECOND POLYMERIC, DIELECTRIC FILM |

| CURE THE MONOMERIC COMPOSITION |
| TO POLYMERIZE THE TRIAZINE |
| AND FORM A POLYMERIC, DIELECTRIC LAMINATE |

FIG.2

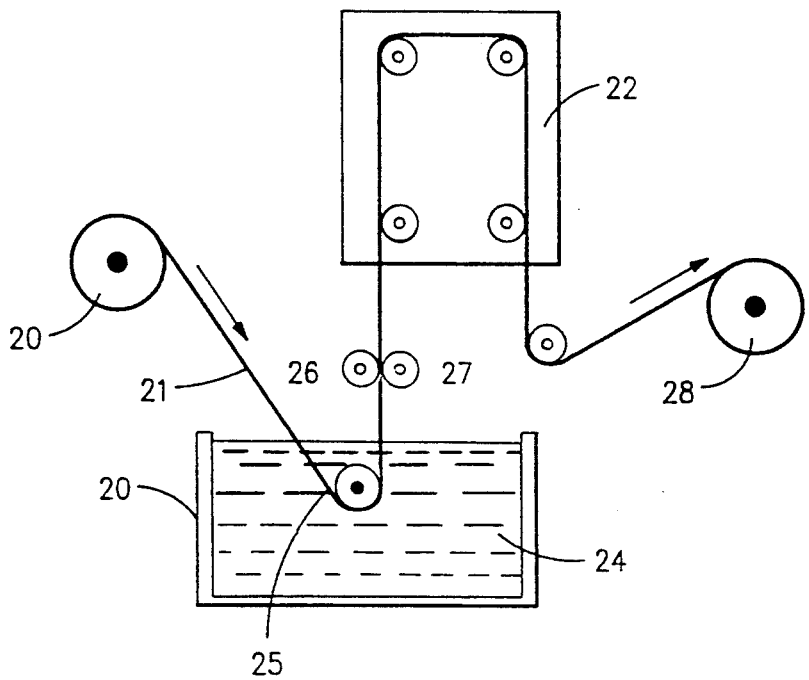

FIG.3

TRIAZINE THIN FILM ADHESIVES

FIELD OF THE INVENTION

This invention relates to the use of triazine resin dielectrics in microelectronic circuit packages as an adhesive between layers of polymeric film in the circuit package.

More particularly the invention relates to dielectic layers and a process for making formed of interleaved organic polymeric films. These films are joined together by polymeric dielectric adhesives. These organic dielectric adhesives provide adhesion between organic films within an individual layer of a package, as well as between a dielectic layer and the circuitization thereon.

The triazine resins are the polymerization product of the reaction:

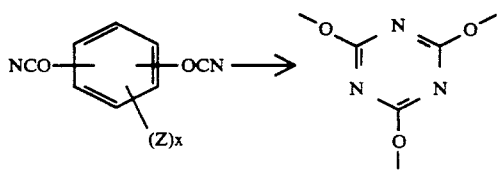

According to the exemplification of the invention dicyanate diphenyl hexafluoroisopropane (6F-BADCY), is suitably initiated to form the highly cross-linked triazine network ply.

Alternatively, the triazine polymer may be a polymeric reaction product of (1) a first dicyanate having the formula NCO—R'—OCN and (2) a second dicyanate having the formula NCO—R"—OCN, where the linking groups (R's) are independently aromatics or aliphatics. In a preferred exemplification R' is diphenyl hexafluoroisopropane and R" is bisphenol M.

The resulting triazine polymer has a low dielectric constant, and is highly resistant to processing chemicals.

Preferably, the adhesive is a cyanate ester polymeric reaction product of (1) a first dicyanate having the formula NCO—R'—OCN and (2) a second dicyanate having the formula NCO—R"—OCN, where the R's are independently aromatics or aliphatics. The use of two or more different monomers allows tailoring of the physical and thermal properties of the adhesive. In a preferred exemplification R' is diphenyl hexafluoroisopropane and R" is bisphenol M.

A further aspect of the invention is that such parameters as the glass transition temperature, $T_g$, can be controlled by the ratio of the fluorinated monomer to the non fluorinated monomer for example, the ratio of the bisphenol M dicyanate to the diphenyl hexafluoroisopropane dicyanate.

In a further particularly preferred exemplification of the invention the substrate, i.e., the dielectric layers, are formed of the polymeric reaction product of 3,3',4,4'-biphenylenetetracarboxylic dianhydride and p-phenylene diamine, and the adhesive is a relatively lower $T_g$ polymeric reaction product of diphenyl hexafluoroisopropane dicyanate, and bisphenol M dicyanate.

According to one method of the invention a polyimide thin film is coated with the triazine precursors, and the composite is partially cured to form an adhesive thin film carrier. This dielectric layer is then processed conventionally, i.e. by building up several plies of the polyimide-triazine, circuitizing, and laminating.

According to an alternative method of the invention a lower $T_g$ triazine polymer is formed and coated onto a polymeric dielectric thin film. The composite is processed conventionally, i.e., by building up several plies of the polyimide-triazine, circuitizing, and laminating.

BACKGROUND OF THE INVENTION

The general structures and manufacturing processes for electronic packages are described in, for example, Donald P. Seraphim, Ronald Lasky, and Che-Yo Li, *Principles of Electronic Packaging*, McGraw-Hill Book Company, New York, N.Y., (1988), and Rao R. Tummala and Eugene J. Rymaszewski, *Microelectronic Packaging Handbook*, Van Nostrand Reinhold, New York, N.Y. (1988), both of which are hereby incorporated herein by reference.

Electronic packages extend from the integrated circuit chip, through the module, card, and board, to the gate and system. The integrated circuit "chip" is referred to as the "zero order package". This chip or zero order package enclosed within its module is referred to as the first level of packaging. The integrated circuit chip provides circuit component to circuit component and circuit to circuit interconnection, heat dissipation, and mechanical integrity.

There is at least one further level of packaging. The second level of packaging in the circuit card. A circuit card performs at least four functions. First, the circuit card is employed because the total required circuit or bit count to perform a desired function exceeds the bit count of the first level package, i.e., the chip, and consequently, multiple chips are required to perform the function. Second, the circuit card provides for signal interconnection with other circuit elements. Third, the second level package, i.e., the circuit card, provides a site for components that are not readily integrated into the first level package, i.e., the chip or module. These components include, e.g., capacitors, precision resistors, inductors, electromechanical switches, optical couplers, and the like. Fourth, the second level package provides for thermal management, i.e., heat dissipation. Several cards may, in turn, be mounted on one board.

Cards and boards may be polymer based or ceramic based. A basic process for polymer based composite package fabrication is the "prepreg" process described by George P. Schmitt, Bernd K. Appelt and Jeffrey T. Gotro, "Polymers and Polymer Based Composites for Electronic Applications" in Seraphim, Lasky and Li, *Principles of Electronic Packaging*, pages 334-371, previously incorporated herein by reference, and by Donald P. Seraphim, Donald E. Barr, William T. Chen, George P. Schmitt, and Rao R. Tummala, "Printed Circuit Board Packaging" in Tummala and Rymaszewski, *Microelectronics Packaging Handbook*, pages 853-922, also previously incorporated herein by reference.

In the "prepregging" or impregnation process for polymeric electronic circuit package fabrication, a fibrous body, such as a non-woven mat or woven web, is impregnated with a laminating resin. This step includes coating the fibrous body with, for example, an epoxy resin solution, evaporating the solvents associated with the resin, and partially curing the resin. The partially cured resin is called a B-stage resin. The body of fibrous material and B-stage resin is the prepreg. The prepreg, which is easily handled and stable, may be cut into sheets for subsequent processing.

Typical resins used to form the prepreg include epoxy resins, cyanate ester resins, epoxy cyanate blends, bismaleimides, polyimides, hydrocarbon based resins, and fluoropolymers. The epoxide compounds used to prepare prepregs comprise in general those compounds containing at least one vicinal epoxy group, i.e., at least one

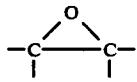

group. Examples of suitable epoxy resins for prepregs are represented by the general formula:

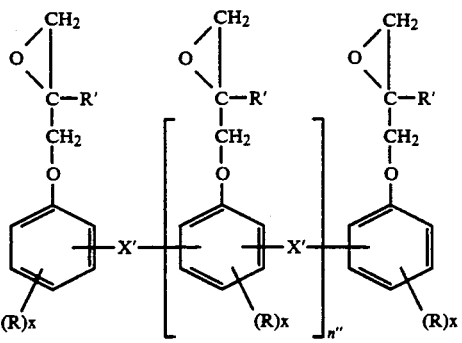

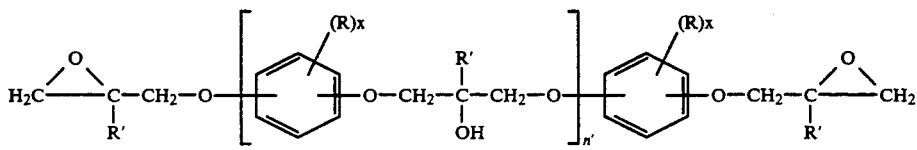

The epoxies may be saturated or unsaturated, aliphatic, cycloaliphatic, aromatic or heterocyclic and contain if desired substituents such as halogen atoms, hydroxyl groups, ether radicals and the like. These systems may be monomeric, oligomeric or polymeric in nature. Suitable epoxides are disclosed in the U.S. Pat. Nos. 3,356,624; 3,408,219; 3,446,762 and 3,637,618.

Preferred epoxides are the glycidyl polyethers of polyhydric phenols and polyhydric alcohols, especially the glycidyl polyethers of 2,2-bis(4-hydroxyphenyl) propane having an average molecular weight between about 300 and 3,000 and an epoxide equivalent weight between about 140 and 2,000 and more preferably an epoxide equivalent weight of from about 140 to about 650.

Preferably the base resin which has an epoxide equivalent weight of from 175 to 195, is derived from condensing epichlorohydrin with 2,2-bis(4-hydroxyphenyl)propane to form 2,2-bis((p-2,3 epoxypropoxy) phenyl) propane.

A widely used class of epoxides includes the epoxy polyethers obtained by reacting an epihalohydrin, such as epichlorohydrin with either a polyhydric phenol or a polyhydric alcohol. Some examples of dihydric phenols include 4,4'-isopropylidene bisphenol, 2,4'-dihydroxydiphenylethyl methane, 3,3-dihydroxydiphenyldiethylmethane, 3,4'-dihydroxydiphenylmethylpropyl methane, 2,3'-dihydroxydiphenylethylphenylmethane, 4,4'-dihydroxydiphenylpropylphenylmethane, 4,4'-dihydroxydiphenylbutylphenylmethane, and the like.

Another class of polymeric epoxides represented by the general formula shown below, includes the epoxy novolac resins obtained by reacting, preferably in the presence of a basic catalyst, e.g. sodium or potassium hydroxide, an epihalohydrin, such as epichlorohydrin, with the reaction product of an aldehyde, e.g. formaldehyde, and either a monohydric phenol or a polyhydric phenol. Further details concerning the types and preparation of epoxy resins can be obtained in Lee, H. and Neville, K., *Handbook of Epoxy Resins*, McGraw Hill Book Co., New York, 1967. Typical formulae are:

where each X' is independently a divalent hydrocarbon group having from 1 to about 6, preferably from 1 to about 4 carbon atoms, each R' is independently hydrogen or an alkyl group having from 1 to about 4 carbon atoms; n' has a value of from about zero to about 30, preferably from zero to about 5; n" has a value of from about 0.001 to about 6, preferably from about 0.01 to about 3; x' has a value of 3, each R is independently hydrogen a hydrocarbyl or hydrocarbyloxy group having from 1 to about 10, preferably from 1 to about 4 carbon atoms, halogen, preferably chlorine or bromime.

Particularly suitable epoxides which can be employed herein include, for example, the diglycidyl ethers of resorcinol, bisphenol A, 3,3',5,5'-tetrabromobisphenol A, the triglycidyl ether of tris(hydroxylphenyl) methane, the polyglycidyl ether of a phenol formaldehyde condensation product (novolac), the polyglycidyl ether of a dicyclopentadiene and phenol condensation product and the like.

One type of prepreg is the FR-4 prepreg. FR-4 is a fire retardant epoxy-glass cloth material, where the epoxy resin is the diglycidyl ether of 2,2'-bis(4-hydroxyphenyl) propane. This epoxy resin is also known as the diglycidyl ether of bisphenol-A, (DGEBA). The fire retardancy of the FR-4 prepreg is obtained by including approximately 15-20 weight percent bromine in the resin. This is achieved by incorporating the appropriate amount and type of resins or other brominated compounds.

Still other bisphenol A diglycidyl ether resins are used to form rigid circuit boards. Among the resins so used to produce "prepreg" for reinforced laminate compositions for circuit boards are the lower molecular weight bisphenol A diglycidyl ether resins, including bromine-substituted resins for imparting some degree of flame resistance as disclosed by U.S. Pat. No. 4,782,116. Such epoxy resins are of relatively low equivalent weight, in the area of 180 to 200, using non brominated resin for example, so that the epoxy group content is relatively high, i.e., each relatively short repeating unit contains two epoxy groups, which results in an increase in the dielectric constant of the compositions after curing.

Other epoxy resin formulations useful in providing prepregs include high functionality resins, such as epoxidized cresol novolacs, and epoxidized derivatives of tris-(hydroxyphenyl) methane. The multifunctional epoxy resins are characterized by high glass transition temperatures, high thermal stability, and reduced moisture up take.

Phenolic cured epoxies such as Ciba-Giegy RDX86-170, Ciba-Giegy RD787-211, Ciba-Giegy RD87-212, Dow Quatrex 5010, Shell Epon 1151, and the like are also used in forming prepregs. These products are mixtures of epoxies, with each epoxy having a functionality of at least 2, and an imidazole catalyst.

Cyanate resins are also used in forming prepregs. One type of cyanate ester resin includes dicyanates reacted with methylene dianiline bis-maleimide. This product may also be reacted with compatible epoxides to yield a three component laminate material. One such laminate material is a 50:45:5 (parts by weight) of epoxy: cyanate: maleimide. Typical of cyanate ester resins useful in forming prepregs is the product of bisphenol A dicyanate and epoxy, which polymerizes during lamination to form a crosslinked structure.

Another class of dielectric substrates are film adhesive systems. These differ from above described fiber-resin systems by the use of an adhesive bearing film. One polyimide used for the film to carry the adhesive in a film adhesive system, is a polyimide based on diphenylene dianhydride, described in U.S. Pat. No. 4,725,484 to Kiyoshi Kumagawa, Kenji Kuniyasu, Toshiyuki Nishino, and Yuji Matsui for Dimensionally Stable Polyimide Film and Process for Preparation Thereof. This patent describes a copolymer of 3,3',4,4'-biphenylenetetracarboxylic dianhydride and p-phenylene diamine, commercially known as Upilex S.

Some proposed adhesive mixtures contain substantial amounts of the epoxy resin relative to the dicyanate polymer(s), producing an even higher dielectric constant. Also in such compositions the glass transition temperature and processing or curing temperature generally are reduced to such an extent that the thermal stability of the cured prepregs or laminates is unsatisfactory for high temperature processing applications.

However, the presently known film adhesive systems and fiber adhesive systems suffer from shortcomings. For example, epoxy-glass systems have a relatively high dielectric constant, and relatively poor thermal stability, while polyimide glass systems have a poor copper peel strength. Attempts to substitute polymeric fibers or films for the glass fibers have introduced problems of microcracking and poor mechanical properties.

OBJECTS OF THE INVENTION

Thus, it is one object of our invention to provide an adhesive for bonding dielectric sheets together to form a dimensionally stable dielectric substrate.

Another object of our invention is to provide a low dielectric constant, thermally stable composite for microelectronic circuit packages.

Further more another object of our invention is to provide a method for making the film supported adhesive composite for use as a dielectric layer in circuit packaging.

SUMMARY OF THE INVENTION

According to the method and composition of the invention triazine polymers are used as an adhesive between thin films of dielectric to form dielectric layers for electronic circuit packages.

In the fabrication of organic polymeric microelectronic circuit packages, thin films or woven glass fabric are coated with a monomer solution or oligomer. The solvent in the monomer solution or oligomer is evaporated, and the monomer partially cured to yield a B-stage resin. The composite of woven glass fabric and B-stage resin is called a prepreg. In the production of a dielectric sheet several plies of prepreg are sandwiched between sheets of copper foil and laminated at elevated temperature and pressure. This fuses and cures the resin.

In this way dielectric layers are formed of interleaved organic polymeric films that are bonded by lamination of the B-stage resin. According to the invention disclosed herein, the individual plies or film are joined together by polymeric triazine dielectric adhesives. These organic dielectric adhesives provide adhesion between organic plies or films within an individual layer of a package, as well as between a dielectric layer and the circuitization thereon.

The triazine resins are the polymerization product of the reaction:

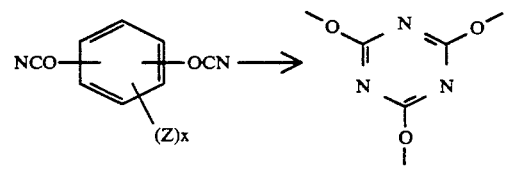

According to one exemplification of the invention one or more dicyanate such as dicyanate diphenyl hexafluoroisopropane, is suitably initiated to form the highly crosslinked triazine network, for example a symmetrical triazine.

In a preferred exemplification of the invention, the triazine polymer is a copolymeric reaction product of (1) a first dicyanate having the formula NCO—R'—OCN and (2) a second dicyanate having the formula NCO—R''—OCN, where the R's are independently aromatics or aliphatics. The use of two or more different monomers allows tailoring of the physical and thermal properties of the adhesive. In a particularly preferred exemplification R' is diphenyl hexafluoropropane and R'' is bisphenol M unit.

The resulting triazine polymer has a low dielectric constant, and is chemically resistant to processing solvents.

A further aspect of the invention is that such parameters as the glass transition temperature, Tg, can be controlled by the ratio of the fluorinated monomer to the non fluorinated monomer for example, the ratio of the diphenyl hexafluoroisopropane dicyanate to the bisphenol M dicyanate.

In a further particularly preferred exemplification of the invention the substrate, i.e., the dielectric layers, are formed of the polymeric reaction product of 3,3',4,4'-biphenylenetetracarboxylic dianhydride and p-phenylene diamine, and the adhesive is a relatively lower Tg polymeric reaction product of diphenyl hexafluoroisopropane dicyanate, and bisphenol M dicyanate.

According to one method of the invention a polyimide thin film is coated with the triazine precursors, and the composite is partially cured to form a thin film based prepreg. This prepreg is then processed conventionally, i.e., by building up several plies of the polyimide triazine, circuitizing, and laminating.

According to an alternative method of the invention a lower Tg triazine polymer is formed and coated onto a polymeric dielectric thin film. The composite is processed conventionally, i.e., by building up several plies of the triazine coated material to form the layers, circuitizing the layers, and laminating the circuitized layers.

According to a still further exemplification of the invention, there is provided a microelectronic circuit package with an organic polymeric dielectric substrate. The substrate is built up to laminated plies of polymer, with a polymeric triazine dielectric adhesive joining the plies. The triazine dielectric adhesive is a copolymer of (1) a first dicyanate having the formula NCO—R'—OCN and (2) a second dicyanate having the formula NCO—R''—OCN, where the R's are different moieties. R' and R'' are individually chosen from the group consisting of aromatics and aliphatics.

THE FIGURES

The invention may be understood by reference to the figures.

FIG. 2 is flow chart of a method for fabricating a microelectronic circuit package incorporating the organic polymeric dielectric of the invention.

FIG. 3 is a schematic representing the impregnation process for the dielectric film of the invention

DETAILED DESCRIPTION OF THE INVENTION

Figure 1:
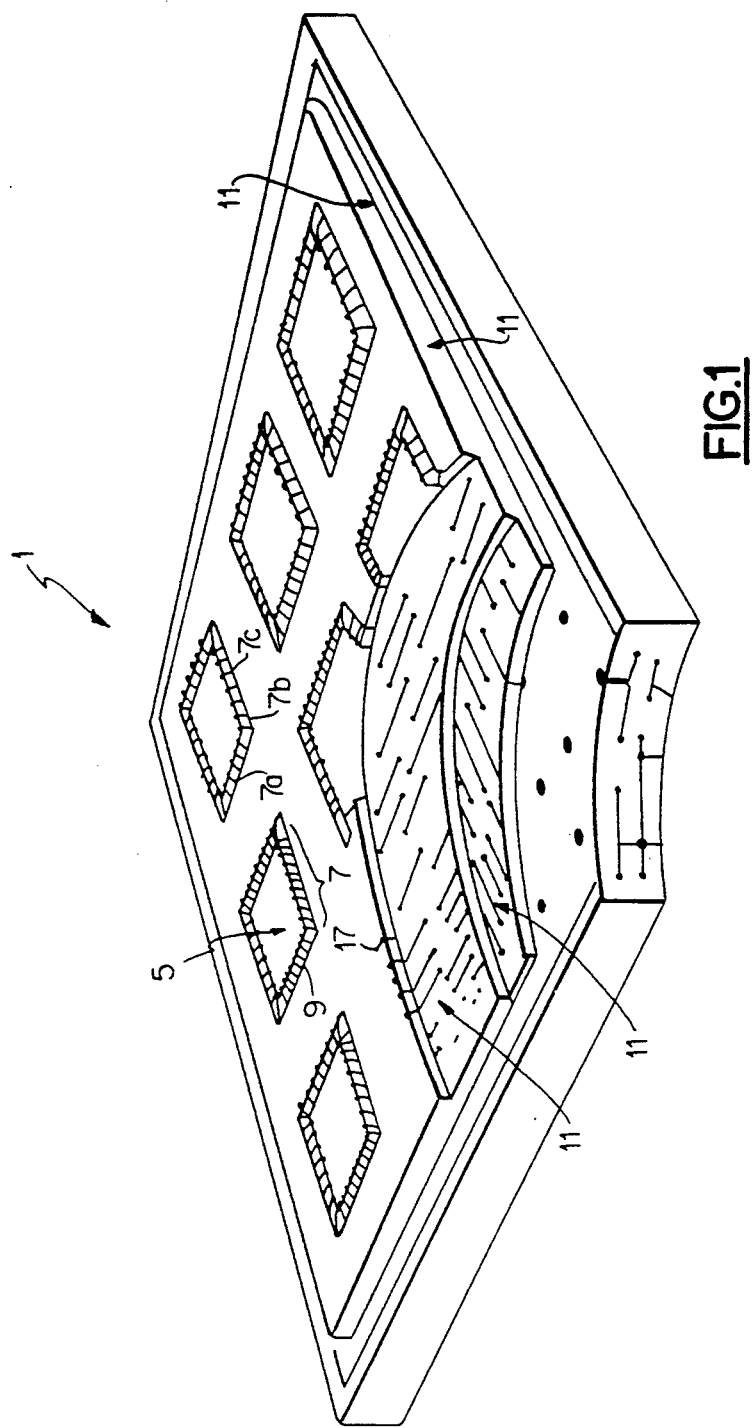
FIG. 1 is an isometric view, in partial cutaway, of a microelectronic circuit package incorporating the organic polymeric dielectric of the invention.

Triazine resins are particularly desirable dielectric adhesives for electronic circuit packages. As adhesives, triazine polymers find utility in joining the individual thin films of prepreg or polymer making up a single layer of an organic, polymeric, microelectronic circuit package. Triazine polymers also find utility as adhesives joining circuitization to the polymeric dielectric layers, and joining circuitized dielectric layers together.

Triazines are produced by the reaction

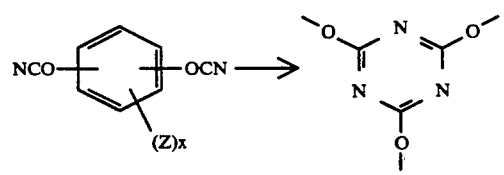

Suitable aromatic polymeric cyanates which can be employed herein include those represented by the following general formulae:

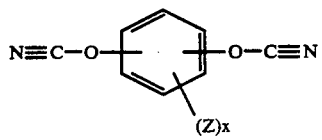

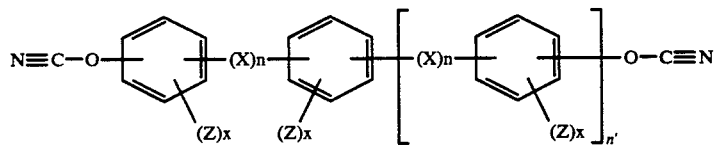

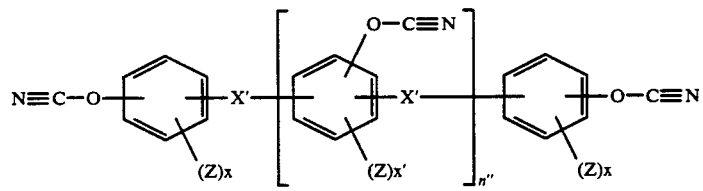

where each Z is independently hydrogen, a hydrocarbyl, or hydrocarbyloxy group having from 1 to about 4 carbon atoms, chlorine, bromine or a —O—CN group. X', x, x', n', n'' are as previously defined and X is a divalent hydrocarbon group having 1 to about 10, preferably from 1 to about 4 carbon atoms,

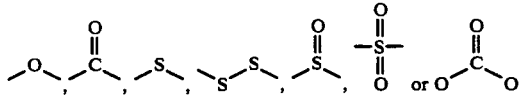

and n zero or 1 and x has a value of 4.

Suitable aromatic cyanates include for example, bisphenol A dicyanate the dicyanates of 4,4'-dihydroxydiphenyl oxide, resorcinol, 4,4'-thiodiphenol, 4,4'-sulfonyldiphenol, 3,3',5,5'-tetrabromobisphenol A, 2,2',6,6'-tetrabromobisphenol A, 3-phenyl bisphenol A, 4,4'-dihydroxybiphenyl, 2,2'-dihydroxybiphenyl, 2,2',4,4'-tetrahydroxydiphenyl methane, 2,2',6,6'-tetramethyl-3,3',5,5'-tetrabromobisphenol A, 3,3'-dimethoxybisphenol A, the tetracyanate of 2,2',4,4'-tetrahydroxydiphenylmethane, the tricyanate of tris(hydroxyphenyl)methane, the cyanate of a phenolformaldehyde condensation product, the cyanate of a dicyclopentadiene and phenol condensation product and the like which can be used either alone or in combinations.

The aromatic cyanates are prepared by reaction of stoichiometric quantity of a cyanogen halide with an aromatic phenol in the presence of a base. This reaction is well known and is described in U.S. Pat. No. 3,755,402. Suitable aromatic phenols include, for example those represented by the formulae shown above except where each —O—CN group is replaced by a hydroxyl group. Suitable cyanogen halides include cyanogen bromide and cyanogen chloride. Suitable bases include both inorganic bases and tertiary amines such as sodium and potassium hydroxide, triethylamine, mixtures thereof and the like. Most preferred is triethylamine. The reaction is carried out in an organic solvent, such as ethylacetate, toluene, xylene, chlorinated hydrocarbons, acetone, diethylketone and the like. A preferred solvent is methylene chloride. The reaction is carried out at low temperature preferably between about −30 and 15 degrees C.

One reason for the desirability of triazines is that suitably compounded triazines are capable of being cured at FR-4 epoxy laminating conditions to form adhesively bonded triazine composites. A further reason for the suitability of appropriately blended triazines for adhesively joining plies of polymeric dielectric layers is that, like epoxy resins, triazines process through a B-stage. This is a particular advantage in processing. Moreover, the preferred triazines of the invention have outstanding high temperature properties, i.e., a glass transition temperature, Tg, of 180 to 290 degrees C. The preferred triazines also have desirable electrical properties, such as a reasonably low dielectric constant, Er of 2.6 to 3.0. Moreover, the preferred triazines have flame retardance and degradation temperatures greater than 400 degrees C.

One particularly desirable adhesive is the copolymer from the reaction of dicyanate hexafluoroisopropane, having the formula represented by

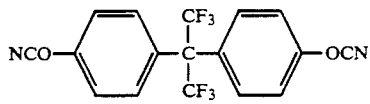

and bisphenol M dicyanate, having the formula represented by

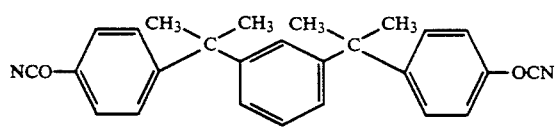

Other cyanate esters represented by the chemical structures shown below can be incorporated in these compositions.

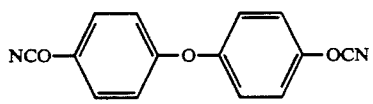

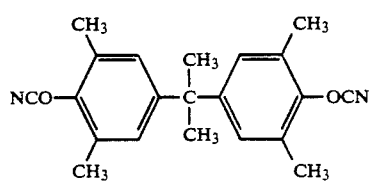

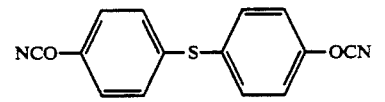

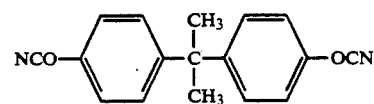

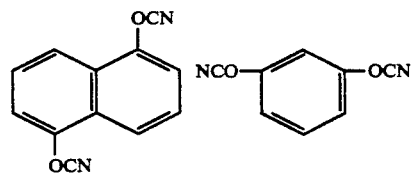

In the dielectric composite, the triazine polymer adhesive is supported and reinforced by the thin film, e.g., about 1 to 5 mils thick. This thin film may be a prepreg film of fiber and adhesive, for example epoxy, FR-4 epoxy (brominated DGEBA), phenolic cured epoxy, and cyanate ester resins. Alternatively, the thin film may be a polyimide film, as the polymeric reaction product of (1) a tetracarboxylic dianhydride, such as 3,3',4,4'-biphenylene tetracarboxylic dianhydride, having the formula represented by

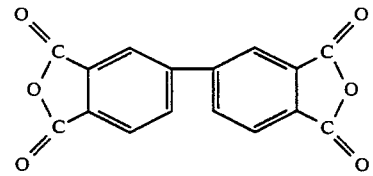

and (2) a diamine, such as 4,4'-diaminophenyloxide, having the formula represented by

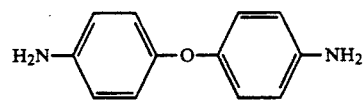

or p-phenylene diamine, having the formula represented by

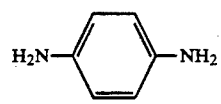

One such polyimide thin film is the Upilex-S a commercial product of Ube Industries, Ltd. Upilex-S is a product of the reaction of 3,3',4,4'-biphenylenetetracarboxylic dianhydride and p-phenylene diamine represented by the formula

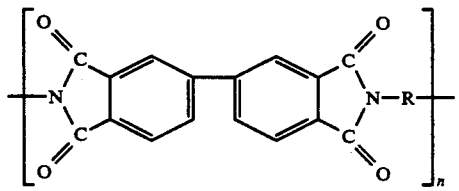

After the triazine is coated onto a thin film, the triazine is cured to form a B-stage resin. The thin film is laminated with other thin films or plies to build up a layer of dielectric which is laminated and cured from a B-stage resin to a crosslinked matrix.

The triazine network may be a copolymeric polymerization product of a symmetrical cyanate the dicyanate diphenyl hexafluoroisopropane and an unsymmetrical monomer the bisphenol M dicyanate represented by the formula:

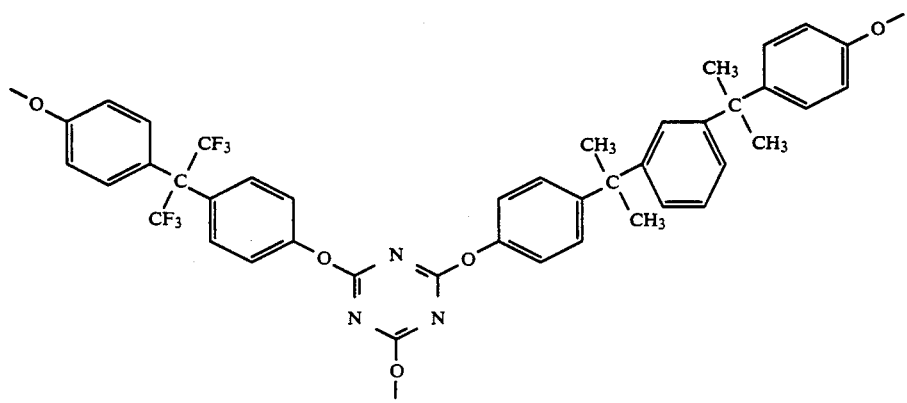

Alternatively, and in a particularly preferred exemplification of the invention, the triazine is a copolymer, for example a copolymer of (1) a first dicyanate having the formula NCO—R'—OCN, and (2) a second dicyanate having the formula NCO—R"—OCN, where the R's are different moieties chosen from the group consisting of aromatics and aliphatics. R' and R" may be chosen so as to optimize one or more properties of the triazine polymer adhesive, such as glass transition temperature.

In one alternative embodiment one of linking units is diphenyl hexafluoroisopropane unit and the other is bisphenol M. The bisphenol M unit could also be replaced by the bisphenol P unit which represents a symmetrical molecule.

According to this embodiment of the invention compositions of bisphenol M dicyanate and diphenyl hexafluoroisopropane dicyanate with zinc octoate as the cyclotrimerization catalyst in methyl ethyl ketone solvent were prepared for testing as adhesive films on sheets of Upilex S. The sheets were heated to 140 degrees C. to drive off the methyl ethyl ketone solvent and form a triazine B-stage resin. The triazine coated Upilex-S sheets were then placed between 1 ounce copper foils, placed in a laminating press, and heated. Heating was to 150 degrees C. for 30 minutes and 210 degrees C. for one hour, at a laminating pressure of 150 to 300 pounds per square inch. The glass transition temperature versus monomer composition data shown in FIG. 3 were obtained.

The composite is particularly useful as a layer in a multilayer printed circuit card or board used in electronic packaging. For example the printed circuit board or card, 1, shown in FIG. 1, and also referred to as an electronic circuit package, is capable of and adapted to receive at least one microelectronic integrated circuit chip, 5. The IC chip, 5, has leads, 7, for example, signal leads, 7a, a power lead, 7b, and a ground lead, 7c, communicating with corresponding circuit elements in the circuit package, 1, through a chip carrier, 9. The circuit package, 1, is a laminate of individual cores, 11, at least one layer or core 11 comprising a substrate of the above described organic polymeric dielectric composite. Individual layers, 11, of the package 1 may carry power cores, buried signal circuitization, or external circuitization 17.

According to a still further exemplification of the invention, illustrated in the flow chart of FIG. 2, there is provided a method of fabricating a circuit board layer for incorporation in a multilayer circuit board or card. The method includes the steps of providing an organic polymeric film.

FIG. 3 illustrates a process of making the said composite film comprising a tank (20) containing the solution of the resin for coating the film (21) and an oven (22). The film (21) which is stored in a reel (23) is unreeled and passed through the resin tank (20) where it is held immersed in the resin solution (24) by the roll (25). Exiting the dip tank the film passes between metering rolls (27,27 ) which control the resin content and provide a certain thickness of adhesive on the film after drying. The coated film is then guided into the oven (22) where it is heated to remove solvent and partially cure or B-stage the resin to a non-tacky state but capable of flow and final curing upon subsequent heating during the lamination process. After cooling the coated film is wound onto a take-up reel (28) or slit into pieces of the appropriate dimensions for subsequent lamination to copper and circuitization.

The compositions of this invention are made by blending the dicyanate esters in the amounts of about 5 to about 95 parts by weight of the 6F-BADCY or prepolymer with about 95 to about 5 parts by weight of bisphenol M dicyanate. Preferred blends comprise from about 30 to about 50 parts by weight of 6F-BADCY. This composition can be used as is or can be partially advanced to form prepolymers of the triazine nature.

Prepolymers are preferred in the prepregging applications since they can be processed a lot easier than the crystalline monomers which tend to crystallize out upon evaporation of the solvent and result in poor films during the impregnation step.

The compositions are cured at high temperatures for a time sufficient to develop a complete cured network. The curing reaction can be conducted at temperatures of about 180 degrees C. to about 280 degrees C. depending on the ratio of the two components in the mixture. The higher the content of bisphenol M dicyanate is the lower the curing temperature.

The monomeric or oligomeric composition may be a liquid composition of about 5 weight percent to about 95 weight percent monomer or oligomer, as dicyanate diphenyl hexafluoroisopropane, and about 95 weight percent to about 5 weight percent, as bisphenol M dicyanate and polymerization catalyst, as 0.3 to about 0.8 zinc octoate, in a solvent, as methyl ethyl ketone (weight percentages are based on triazine precursor, catalyst, and solvent).

The monomeric liquid is applied to a suitable substrate, including a resin reinforced fibrous body or mat, or to a polymeric substrate, for example, by dipping, spraying, or otherwise coating the substrate. Alternatively the substrate, or a resin containing fibrous body to be coated is fed through a dip tank or bath of the triazine precursors, filler, solvent, and polymerization catalyst. A drying step may be carried out at this time.

After the desired coating thickness is attained, the material may be cured to form a triazine B-stage resin for subsequent use as an adhesive. Pressing and lamination of the adhesive coated sheets or substrates is combined with polymerization of the triazine adhesive.

Lamination and curing may be carried out in staged process, for example in a two-stage process, such as 2-5 minutes at 140 degrees C. followed by 30 minutes at 180 to 270 degrees C. In this way substantially complete cross linking is achieved. Throughout this time the laminate is maintained under pressure.

These compositions can be cured by heat alone or by the use of a catalyst plus heat. Curing catalysts include mineral or Lewis acids, bases such as alkali metal hydroxides, alkali metal alcoholates or tertiary amines, salts such as sodium carbonate or lithium chloride or active hydrogen containing compounds, such as bisphenols and monophenols.

Additional catalysts are those described in U.S. Pat. Nos. 3,962,184; 3,694,410 and 4,026,213. Examples of these catalysts include tin and zinc octoates and stearates, copper acetylacetonate, phenol, catechol, triethylenediamine and chelates of iron, cobalt, zinc, copper, manganese and titanium with bidentate ligands such as catechol. Such catalysts are used in concentrations at about 0.001 to about 10 parts by weight per 100 parts by weight of the cyanate monomer or oligomers. A preferred catalyst is a liquid solution of metal carboxylate e.g. zinc octoate in mineral spirits. This catalyst is used in the amounts of about 0.001 to about 0.5 parts by weight of metal.

According to a still further exemplification of the invention, there is provided a microelectronic circuit package with a substrate formed of at least two layers of a polymeric, organic dielectric, with a polymeric triazine dielectric adhesive joining the two layers. The triazine dielectric adhesive is a copolymer of (1) a first dicyanate having the formula NCO-R'-OCN, and (2) a second dicyanate having the formula NCO-R''-OCN, where the R's are different R' and R'' are individually chosen from the group consisting of aromatics and aliphatics. Preferably, one of the linking groups is diphenyl hexafluoroisopropane, and the other is bisphenol M or bisphenol P unit.

The dicyanates and prepolymers of this invention can be blended with polyepoxide resins and can be cured to form useful thermosetting adhesives on polymeric films. Such polyepoxide resins are the well-known glycidyl ethers of polyhydric phenols described above.

EXAMPLES

Having described the basic concepts of the present invention, reference is now made to the following examples, which are provided by way of illustration, and not by way of limitation, on the practice of the present invention. Parts and percentages unless otherwise specified are parts and percentages by weight.

EXAMPLE 1

Figure 4:
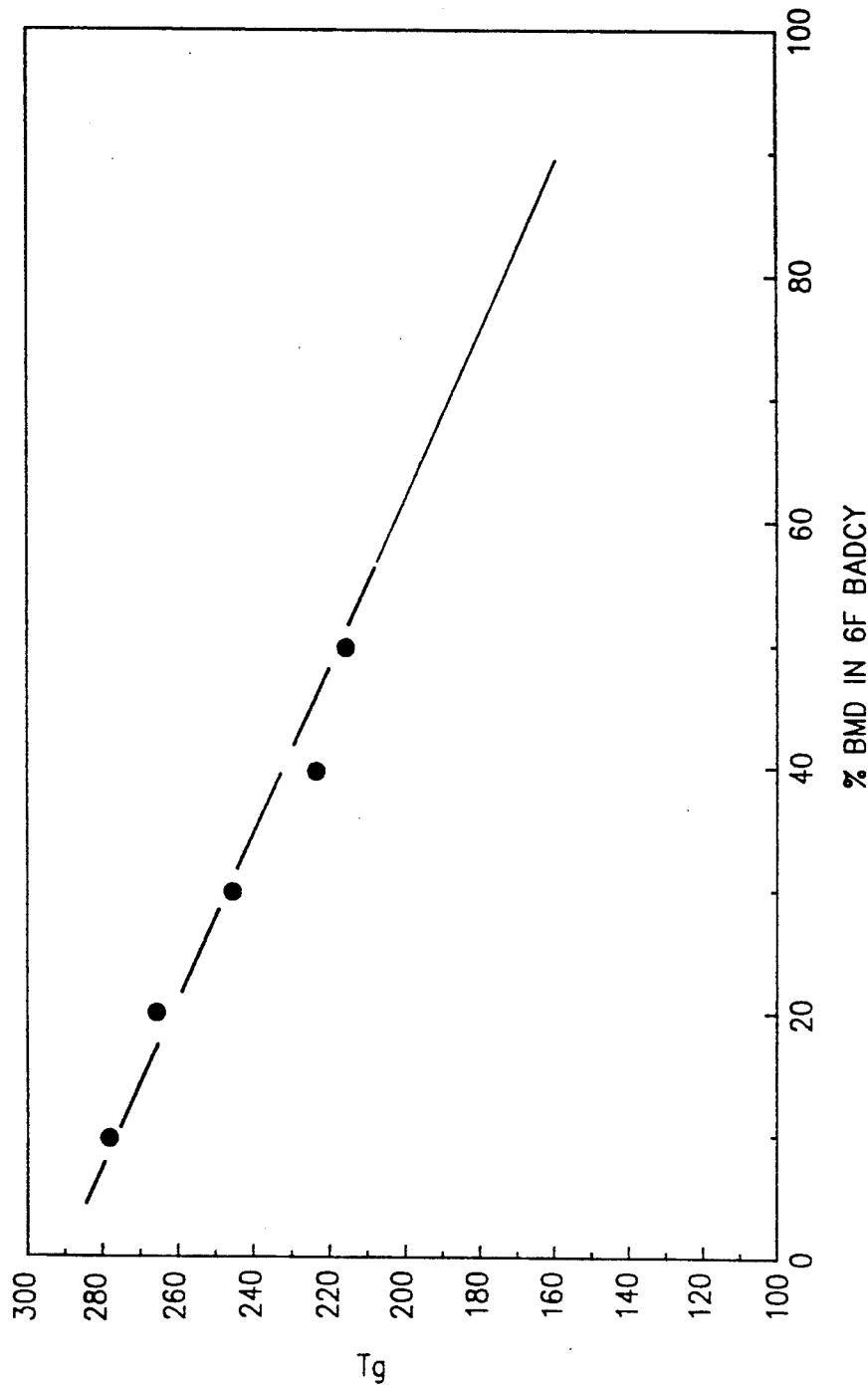
FIG. 4 is a chart of the glass transition temperature, Tg as a function of composition for the triazine network formed during crosslinking.

A solution containing 40 parts by weight of RTX-366, bisphenol M dicyanate, from Hi-Tek Polymers, Inc., 80 parts by weight of Arocy-40S, dicyanate diphenyl hexafluoroisopropane, from Hi-Tek Polymers, Inc., and 0.3 parts by weight of zinc octoate (8 weight percent zinc in mineral spirits) from Money Chemicals in 90 parts by weight methyl ethyl ketone is prepared. This resin composition is applied onto a 2 mil thick film of Upilex SGA from Ube Industries, Ltd. The wet film is heated to 140 degrees C. for about two-three minutes to drive off the solvent and B-stage the resin. In this way a composite is obtained having an adherent film of triazine copolymeric product on a thin polyimide film. The composite structure is then layered between sheets of one ounce copper foil, placed in a heated press, and heated to 200 degrees C. for 30 minutes, and thereafter to 250 to 300 degrees C. for 30 minutes while maintaining a pressure of 150 to 300 pounds per square inch. The glass transition temperature measured by a Differential Scanning Calorimeter was determined to be in the range of about 240 degrees C. (FIG. 4).

As a result a cured laminate is obtained having an adherent triazine film on a thin polyimide film.

EXAMPLE 2

A resin composition is prepared containing 60 parts by weight of RTX-366, bisphenol M dicyanate, from Hi-Tek Polymers, Inc., 60 parts by weight of Arocy-40S, dicyanate diphenyl hexafluoroisopropane, from Hi-Tek Polymers and 0.3 parts by weight of zinc octoate (8 weight percent zinc in mineral spirits) from Money Chemicals in 90 parts by weight methyl ethyl ketone. This resin composition is applied onto a 2 mil thick film of Upilex SGA from Ube Industries, Ltd. The wet film is heated to 140 degrees C. for about two-three minutes to B-stage the resin and drive of the solvent. In this way a composite is obtained having an adherent film of triazine copolymeric product on a thin polyimide film. The composite structure is then layered between sheets of one ounce copper foil, placed in a heated press, and heated to 200 degrees C. for 30 minutes, and thereafter to 220 to 230 degrees C. for 30 minutes while maintaining a pressure of 150 to 300 pounds per square inch. The glass transition temperature measured by a Differential Scanning Calorimeter was determined to be in the range of about 220 degrees C.

As a result a cured laminate is obtained having an adherent triazine film on a thin polyimide film.

EXAMPLE 3

A resin composition is prepared containing 84 parts by weight of RTX-366, bisphenol M dicyanate, from Hi-Tek Polymers, 36 parts by weight of Arocy-40S dicyanate, diphenyl hexafluoroisopropane, from Hi-Tek Polymers and 0.3 parts by weight of zinc octoate (8 weight percent zinc in mineral spirits) from Money Chemicals in 90 parts by weight methyl ethyl ketone. This resin composition is applied onto a 2 mil thick film of Upilex SGA from Ube Industries, Ltd. The wet film is heated to 140 degrees C. for about two-three minutes to B-stage the resin and drive of the solvent. In this way a composite is obtained having an adherent film of triazine copolymeric product on a thin polyimide film. The composite structure is then layered between sheets of one ounce copper foil, placed in a heated press, and heated to 180 degrees C. for 30 minutes, and thereafter to 200 to 210 degrees C. for 60 minutes while maintaining a pressure of 150 to 300 pounds per square inch. The glass transition temperature measured by a Differential Scanning Calorimeter was determined to be in the range of about 185 degrees C. This treatment results in a cured laminate having an adherent triazine film on a thin polyimide film.

While the invention has been described with respect to certain preferred embodiments and exemplifications, it is not intended to limit the scope of the invention thereby, but solely by the claims appended hereto.

We claim:

1. An electronic circuit package having a substrate comprising a plurality of organic, dielectric, polymeric sheets, at least one pair of said polymeric sheets facing each other and adhesively joined together by a triazine copolymer of (1) diphenyl hexafluoroisopropane dicyanate, and (2) bisphenol M dicyanate.

2. A composite for use as a dielectric in a microelectronic circuit package, said composite comprising a plurality of organic, dielectric, polymeric sheets, at least one pair of said polymeric sheets facing each other and adhesively joined together by a triazine copolymer of (1) diphenyl hexafluoro isopropane dicyanate, and (2) bisphenol M dicyanate.

3. An organic polymeric dielectric composite comprising:
   a). a pair of organic polymeric films; and
   b). an organic polymeric adhesive therebetween consisting essentially of the reaction product of i) bisphenol M dicyanate and ii) diphenyl hexafluoro isopropane dicyanate.

4. An electronic circuit package having a substrate comprising a plurality of polyimide sheets, at least one pair of said polyimide sheets facing each other and adhesively joined together by an adhesive consisting essentially of triazine chosen from the group consisting of (a) the triazine homopolymer of dicyanate diphenyl hexafluoroisopropane (6F-BADCY), and (b) triazine copolymers of (1) diphenyl hexafluoroisopropane dicyanate, and (2) bisphenol M dicyanate.

5. A composite for use as a dielectric in a microelectronic circuit package, said composite comprising a plurality of polyimide sheets, at least one pair of said polyimide sheets facing each other and adhesively joined together by a triazine chosen from the group consisting of (a) the triazine homopolymer of dicyanate diphenyl hexafluoroisopropane (6F-BADCY), and (b) triazine copolymers of (1) diphenyl hexafluoroisopropane dicyanate, and (2) bisphenol M dicyanate.

6. An organic polymeric dielectric composite comprising:
   a). a pair of polyimide polymeric films; and
   b). an organic polymeric adhesive bonding said pair of polyimide polymeric films together, said organic polymeric, adhesive consisting essentially of a triazine chosen from the group consisting of (1) the triazine homopolymer of dicyanate diphenyl hexafluoroisopropane (6F-BADCY), and (2) triazine copolymers of the reaction product of i) bisphenol M dicyanate and ii) dicyanate diphenyl hexafluoro isopropane.

7. An organic polymeric dielectric composite comprising:
   a). a pair of polyimide polymeric films; and
   b). an organic polymeric adhesive bonding said pair of polyimide polymeric films together, said organic polymeric, adhesive being the triazine reaction product of:
      i) about 5 to 95 weight percent bisphenol M dicyanate, and
      ii) about 95 to 5 weight percent dicyanate diphenyl hexafluoro isopropane.

8. The electronic circuit package of claim 1 wherein at least one of the sheets comprises polyimide.

9. The electronic circuit package of claim 8 wherein at least one of the sheets comprises a polyimide having moieties of (i) 3,3',4,4'-biphenylene tetracarboxylic dianhydride and (ii) a diamine chosen from the group consisting of p-phenylene diamine, 4,4'-diaminophenyloxide, and mixtures thereof.

10. The composite of claim 1 wherein at least one of the organic, dielectric, polymeric sheets comprises a polyimide having moieties of (i) 3,3',4,4'-biphenylene tetracarboxylic dianhydride and (ii) a diamine chosen from the group consisting of p-phenylene diamine, 4,4'-diaminophenyloxide, and mixtures thereof.

11. The organic polymeric dielectric composite of claim 3 wherein the organic polymeric adhesive comprises from about 5 to 95 weight percent of bisphenol M dicyanate, and about 95 to 5 weight percent dicyanate diphenyl hexafluoro isopropane.

12. The organic polymeric dielectric composite of claim 3 wherein at least one of the organic polymeric films comprises polyimide.

13. The composite of claim 3 wherein at least one of the sheets comprises a polyimide having moieties of (i) 3,3',4,4'-diphenylene tetracarboxylic dianhydride and (ii) a diamine chosen from the group consisting of p-phenylene diamine, 4,4'-diaminophenyloxide, and mixtures thereof.

14. The electronic circuit package of claim 4 wherein at least one of the sheets comprises a polyimide having moieties of (i) 3,3',4,4'-biphenylene tetracarboxylic dianhydride and (ii) a diamine chosen from the group consisting of p-phenylene diamine, 4,4'-diaminophenyloxide, and mixtures thereof.

15. The composite of claim 5 wherein at least one of the sheets comprises a polyimide having moieties of (i) 3,3',4,4'-biphenylene tetracarboxylic dianhydride and (ii) a diamine chosen from the group consisting of p-phenylene diamine, 4,4'-diaminophenyloxide, and mixtures thereof.

16. The organic polymeric dielectric composite of claim 6 wherein the organic polymeric adhesive comprises from about 5 to 95 weight percent of bisphenol M dicyanate, and about 95 to 5 weight percent dicyanate diphenyl hexafluoro isopropane.

* * * * *